(12) United States Patent
Tsukamoto

(10) Patent No.: US 6,513,236 B2
(45) Date of Patent: Feb. 4, 2003

(54) METHOD OF MANUFACTURING BUMP-COMPONENT MOUNTED BODY AND DEVICE FOR MANUFACTURING THE SAME

(75) Inventor: Masahide Tsukamoto, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 129 days.

(21) Appl. No.: 09/777,062

(22) Filed: Feb. 5, 2001

(65) Prior Publication Data

US 2001/0015010 A1 Aug. 23, 2001

(30) Foreign Application Priority Data

Feb. 18, 2000 (JP) ........................................ 2000-040618

(51) Int. Cl.⁷ ................................................. H05K 3/10
(52) U.S. Cl. ............................. 29/846; 29/832; 29/840; 29/740; 29/741; 29/743; 438/613; 438/108; 257/738; 228/180.1; 228/4.1; 228/6.2
(58) Field of Search ............................ 29/846, 44, 832, 29/834, 840, 841, 740, 741, 743; 294/2, 64.1; 901/40; 414/737, 752; 228/20.1, 180.1, 2, 4.1, 6.2; 438/613, 108; 257/737, 738

(56) References Cited

U.S. PATENT DOCUMENTS 5,288,008 A * 2/1994 Haji et al. ............... 228/180.2
5,757,078 A * 5/1998 Matsuda et al. ............. 257/737
5,861,678 A * 1/1999 Schrock ....................... 257/783
6,209,196 B1 * 4/2001 Ozono et al. .................. 29/840
6,219,911 B1 * 4/2001 Estes et al. .................... 29/840

FOREIGN PATENT DOCUMENTS

| JP | 1-309343 | 12/1989 |
| JP | 7-297231 | 11/1995 |
| JP | 11204575 A * | 7/1999 |
| JP | 200138244 A * | 5/2000 |

OTHER PUBLICATIONS

Yoshihiro et al. "Advanced Flip Chip Bonding Technique for MCM–L" Proceedings for First Pan Pacific Microelectronics Symposium, p125–131, 1996.

* cited by examiner

Primary Examiner—Ira S. Lazarus
Assistant Examiner—Kathryn S. O'Malley
(74) Attorney, Agent, or Firm—Merchant & Gould P.C.

(57) ABSTRACT

Bump components mounted on a circuit board on a supporting substrate is covered with a flexible separation wall. A pressure difference is provided between the inner and outer sides of the separation wall and thus the bump components are pressed against the circuit board. When heating is carried out in this state, the bump components and the circuit board are connected with a conductive adhesive or solder. During the heating, the circuit board is not deformed. Therefore, a bump-component mounted body can be manufactured with high yield.

22 Claims, 10 Drawing Sheets

METHOD OF MANUFACTURING BUMP-COMPONENT MOUNTED BODY AND DEVICE FOR MANUFACTURING THE SAME

BACKGROUND OF THE INVENTION

1. Field of the Invention

The present invention relates generally to a method of manufacturing a bump-component mounted body in which a bump component such as a flip chip, a chip size package (CSP), or the like can be mounted on a circuit board with a high yield and to a device for manufacturing the same.

2. Related Background Art

Recently, a flip chip mounting method has been receiving much attention as a method of mounting a semiconductor chip. In this method, bumps of electrical conductors are formed on pads (electrode terminals) of a bare semiconductor chip and the bumps and corresponding electrodes on a circuit board are electrically connected. Recently, this technique has been developed considerably since it enables a semiconductor chip to be mounted compactly and provides suitability for a high speed operation because of shortened wiring, as compared to the case of packages with leads such as a conventional quad flat package (QFP). Among flip-chip mounting techniques, mounting by stud bump bonding has high reliability and has come into practical use. In addition, a method of sticking a bare semiconductor directly on a circuit board with solder balls also has been known for many years.

The stud bump bonding method is described in "Advanced Flip Chip Bonding Technique for MCM-L" by Yoshihiro Tomura et al., 1996 Proceedings of First Pan Pacific Microelectronics Symposium, p 125–131 (1996).

CSPs and ball grid arrays (BGA) also are used often since they allow considerable size reduction to be achieved as compared to conventional quad flat packages (QFP). They also have bumps (solder balls) arranged in a plane and therefore, are included in bump components defined in the present invention.

The above methods have been employed widely but have a big problem.

There is no problem when a circuit board is always flat and is not deformed in mounting bump components. However, a general circuit board formed of a composite including, for example, a reinforced core material such as glass fiber or aramid fiber, resin, and copper foil is deformed due to heat inevitably added thereto for melt-bonding of solder balls in mounting bump components or curing of an underfill. Therefore, it is difficult to maintain the flatness of the circuit board. Particularly, when the circuit board is thin and is one such as a flexible circuit board, it can be said that it is substantially impossible to maintain the flatness of the circuit board.

As a method for solving this problem, there is a method in which a circuit board is pressed down together with a semiconductor chip during heating (for instance, an anisotropic conductive film (ACF) is interposed between a semiconductor chip and a circuit board, which then is heated while being pressed). In such a method, however, products inevitably must be processed one by one and thus, the productivity is low.

SUMMARY OF THE INVENTION

The present invention is intended to solve the above-mentioned conventional problem and to provide a method and device for manufacturing a bump-component mounted body allowing a circuit board to be prevented from being deformed due to heat added in mounting bump components.

In order to achieve such an object, the present invention employs the following configurations.

A first method of manufacturing a bump-component mounted body of the present invention includes pressing down a plurality of bump components mounted on a circuit board by a pressure difference provided between inner and outer sides of a flexible separation wall provided to cover the plurality of bump components.

According to this method, it is possible to compel a circuit board to maintain the flatness continuously during heating or other steps in which the deformation may possibly occur and thus the decrease in yield due to the deformation of the circuit board can be prevented.

A second method of manufacturing a bump-component mounted body according to the present invention includes at least injecting an underfill into a space inside a flexible separation wall during or after depressurizing the space inside the flexible separation wall. The space inside the flexible separation wall is formed between a circuit board and the flexible separation wall. The flexible separation wall is provided to cover bump components mounted on the circuit board. This method allows the space inside the flexible separation wall to be filled with the underfill at a high speed with no bubbles being contained.

A third method of manufacturing a bump-component mounted body according to the present invention includes: flip-mounting a plurality of bump components on a circuit board; forming a space inside a flexible separation wall between the flexible separation wall and the circuit board by covering the plurality of bump components with the flexible separation wall; and pressing the bump components against the circuit board by providing a pressure difference between inner and outer sides of the separation wall. This allows the circuit board to be maintained in a flat state continuously during a heating step carried out subsequent to the pressing and steps in which deformation may possibly occur, and thus the mounting yield increases. In addition, this method merely utilizes the pressure difference provided between the inner and outer sides of the separation wall and thus can be carried out at low cost.

The third method further may include, before the flip-mounting, applying a conductive adhesive to bumps of the bump components or to electrodes on the circuit board, and after the pressing of the bump components against the circuit board, drying, curing, or melting the conductive adhesive with the bump components being pressed against the circuit board, injecting an underfill into the space inside the separation wall during or after depressurizing the space inside the separation wall, and curing the underfill. According to this method, a flip-chip mounted body obtained by stud bump bonding can be produced with high yield. In addition, once the bump components are covered with the separation wall, the subsequent steps can be carried out with the separation wall covering the bump components until curing of the underfill is completed.

Furthermore, the third manufacturing method further may include, after the pressing of the bump components against the circuit board, melting solder bumps with the bump components being pressed against the circuit board. The solder bumps are provided on the bump components. According to this method, a flip chip mounted body in which bump components provided with solder balls are mounted can be obtained with high yield.

The third method further may include, after the pressing of the bump components against the circuit board, drying, curing, or melting an adhesive with the bump components being pressed against the circuit board, wherein the adhesive may be provided between the bump components and the circuit board in the flip-mounting. According to this method, a flip-chip mounted body in which an adhesive such as an ACF, an anisotropic conductive paste (ACP), a non-conductive paste (NCP) or the like is used can be obtained with high yield.

The third manufacturing method further may include cutting the circuit board. According to this, for example, a number of small card-type substrates (such as modules, CSPs, BGAs, or the like) with bump components mounted thereon can be manufactured at one time.

In the third manufacturing method, a sheet-like member may be provided between the bump components and the separation wall. According to this method, the separation wall can be prevented from being soiled or the separation wall and the bump-component mounted body can be separated easily. Alternatively, a sheet-like member can be integrated with the completed flip-chip mounted body to be used as an outer package of the flip-chip mounted body.

A device for manufacturing a bump-component mounted body of the present invention includes a supporting substrate on which a circuit board is placed, a flexible separation wall, a separation wall supporter for maintaining the separation wall, and a hermetic space (a space outside the separation wall) formed between the separation wall and the separation wall supporter. According to this device, a pressure difference between the inner and outer sides of the separation wall can be provided easily. Therefore, the above-mentioned manufacturing method of the present invention can be implemented with a simple configuration at low cost.

In the above-mentioned manufacturing device, preferably a space inside the separation wall is formed hermetically by the separation wall and the circuit board when the separation wall supporter maintaining the separation wall and the supporting substrate are combined with the circuit board being interposed therebetween. This allows the circuit board to be pressed against the supporting substrate upon providing the pressure difference between the hermetic space (the space outside the separation wall) and the space inside the separation wall and thus the circuit board is prevented from being deformed. In addition, the space inside the separation wall can be utilized as a mold in injecting an underfill.

Preferably, the above-mentioned manufacturing device further includes a rubber plug into which a pressurization pipe is to be inserted. The pressurization pipe is used for pressurizing the hermetic space defined by the separation wall and the separation wall supporter. According to this, a needle pipe can be inserted into the rubber plug and the hermetic space (the space outside the separation wall) can be pressurized easily. In addition, the pressurized state can be maintained even after the needle pipe is removed after the pressurization.

Preferably, the above-mentioned manufacturing device further includes a rubber plug into which a depressurization pipe for depressurizing the space inside the separation wall is to be inserted. According to this, a needle pipe can be inserted into the rubber plug and the space inside the separation wall can be depressurized easily. In addition, the depressurized state can be maintained even after the needle pipe is removed after the depressurization.

Preferably, the above-mentioned manufacturing device further includes a rubber plug into which an injection pipe is to be inserted. The injection pipe is used for injecting an underfill into the space inside the separation wall. According to this, a needle pipe can be inserted into the rubber plug and the underfill can be injected into the space inside the separation wall. In addition, the pressure difference between the inner and outer sides of the separation wall can be maintained even after the needle pipe is removed after the injection of the underfill.

Furthermore, in the above-mentioned manufacturing device, preferably the supporting substrate urges the circuit board into close contact therewith and maintains the circuit board. According to this, before the separation wall supporter and the supporting substrate are combined, the circuit board can be maintained in a flat state. Even when the hermetic space (the space outside the separation wall) is not pressurized sufficiently in injecting the underfill, the deformation of the circuit board can be prevented.

In the above-mentioned manufacturing device, it is preferable that when the separation wall supporter maintaining the separation wall and the supporting substrate are combined with the circuit board being interposed therebetween, part of the wiring of the circuit board is exposed. According to this, electrical testing can be carried out using the exposed wiring without the separation wall supporter being removed.

DETAILED DESCRIPTION OF THE INVENTION

Embodiments of the present invention are described based on the figures.

First Embodiment

Figure 1:
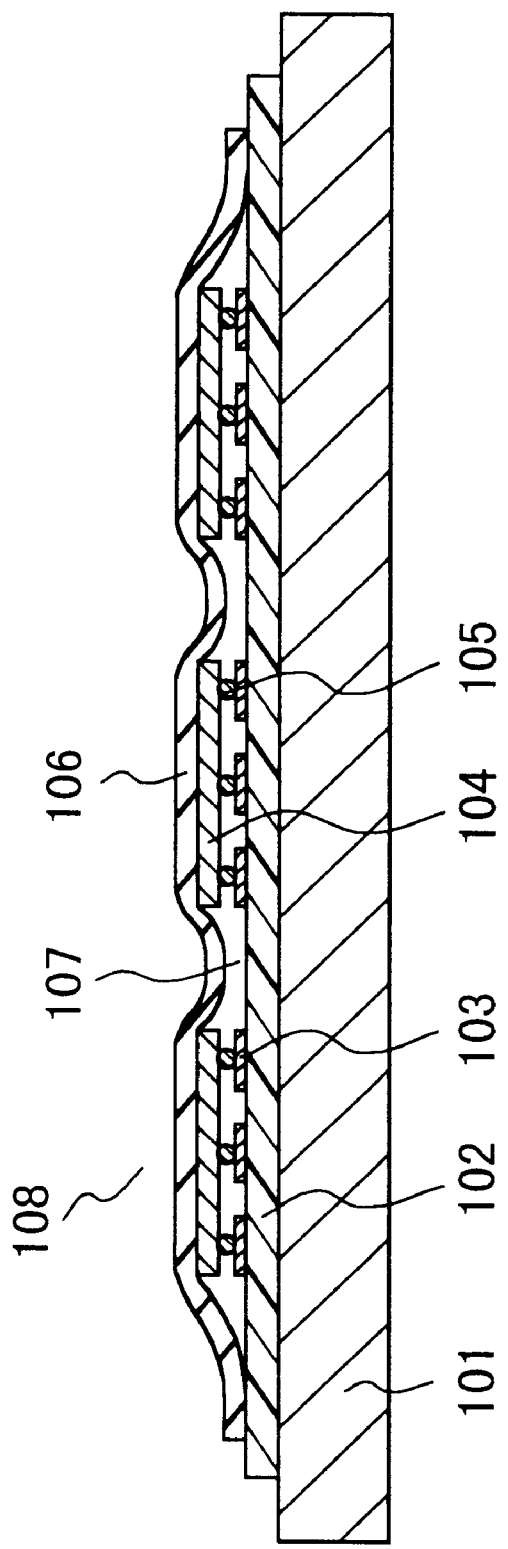
FIG. 1 is a sectional view explaining the principle of a method of manufacturing a bump-component mounted body according to an embodiment of the present invention.

FIG. 1 illustrates the principle of the present invention. FIG. 1 shows a state where a circuit board 102 with electrodes 103 is placed on a supporting substrate 101 of a rigid body with a flat upper surface, and a plurality of bump components 104 provided with bumps 105 are mounted thereon, on which a flexible separation wall 106 is provided to cover the bump components 104. As the circuit board 102, of course, a conventional double-faced circuit board or a multilayer circuit board can be used. Besides, a flexible circuit board that cannot be used in a conventional mounting method also can be used in the present invention. With respect to the material of the circuit board 102, there also is no particular limitation, and a resin substrate, a substrate formed of an organic film, a ceramic substrate, or the like can be used. The circuit board 102 may be, for example, a conventional glass epoxy board, a board having a polyimide film as a base, or a ceramic substrate containing alumina as a main component.

In FIG. 1, a pressure difference is provided between the upper and lower sides of the separation wall 106, i.e. between a space 107 inside the separation wall (hereinafter referred to as an "inner space") formed between the separation wall 106 and the circuit board 102 and a space 108 outside the separation wall (hereinafter referred to as an "outer space"). The pressure difference allows the bump components 104 to be pressed down. While this pressure difference is maintained, a mounting process is carried out. Its specific method is described later.

When the bump components 104 are to be pressed down by the pressure difference, the pressure in the inner space 107 may be set to be lower than that in the outer space 108. For instance, in FIG. 1, the inner space 107 is depressurized to have a pressure of 1 atm (101.3 kPa) or lower and the outer space 108 is pressurized to have a pressure of 2 atm (202.6 kPa). As a result, the bump components 104 can be pressed down with a force of at least 1 atm (101.3 kPa). Naturally, the outer space 108 is not always required to be pressurized. It should be appreciated that even when the outer space 108 is intended not to be pressurized and thus has a pressure of 1 atm (101.3 kPa), a pressing force can be generated when the inner space 107 is depressurized although the pressing force is 1 atm (101.3 kPa) or lower. Alternatively, the inner space 107 may not be depressurized but the outer space 108 may be pressurized, or when the inner space 107 has a pressure of at least 1 atm (101.3 kPa), the outer space 108 may be pressurized to have a higher pressure.

When an underfill is required between the bump components 104 and the circuit board 102, the underfill may be injected at a pressure of 1 atm (101.3 kPa) with the inner space 107 being brought into a vacuum state (at 10 mmHg (1.3 kPa) or lower). When the underfill is injected under a high vacuum, the inner space 107 can be filled with the underfill at a high speed with bubbles hardly being contained. This may be heated in this state, and thus the underfill may be cured. In the case where the underfill has a high viscosity and therefore the injection speed is slow, the injection speed can be increased by the increase in the injection pressure while pressing forces are applied to the bump components 104 upon increasing the pressure in the outer space 108.

In the present invention, the "bump components" denote electronic components provided with protruding electrodes (bumps) and include, for example, not only flip chips, bear chips, CSPs, BGAs, and the like but also chip capacitors with protruding electrodes, chip resistors with protruding electrodes and the like.

Second Embodiment

A method of specifically achieving the above is described with reference to FIG. 2 as follows.

A supporting substrate 101, a circuit board 102, electrodes 103, bump components 104, and bumps 105 are the same as those shown in FIG. 1.

A separation wall 202 has a slightly different shape from that of the separation wall 106 shown in FIG. 1. The separation wall 202 is maintained by a separation wall supporter 201. As shown in FIG. 2, an inner space 107 and an outer space 108 are formed hermetically, respectively. In other words, the periphery of the separation wall 202 is allowed to be in close contact with the upper surface of the circuit board 102 by the separation wall supporter 201 and thus the inner space 107 is formed. On the other hand, the outer space 108 is formed between the separation wall 202 and the separation wall supporter 201. The separation wall supporter 201 is made of a rigid body so as to sustain the whole force. Metal such as, for example, stainless steel may be used for the separation wall supporter 201. The separation wall supporter 201 is fixed to the supporting substrate 101 with some means, which is not shown in the figure. Screws may be used as the fixation means. However, when consideration is given to mass production, a one-touch detachable mechanism is preferable so as to avoid troublesome assembly and disassembly or to achieve mechanization.

The separation wall 202 is flexible. In the present embodiment, a resin having heat resistance and mold releasability, such as silicone resin, is preferable for the separation wall 202. The separation wall 202 with a shape as shown in the figure can be obtained easily by being formed using a mold. The principle of pressing the bump components 104 is the same as in the description of FIG. 1.

In the present embodiment, some new ideas are included. That is, the inner space 107 is depressurized with a depressurization pipe 204 and the outer space 108 is pressurized with a pressurization pipe 205. The bump components 104 are pressed against the circuit board 102 by the pressure difference between the inner and outer sides of the separation wall 202. In this state, an underfill can be injected into the inner space 107 through an injection pipe 203. It is preferred to pressurize the outer space 108 during the injection of the underfill. In the case of using a flexible circuit board as the circuit board 102, when the injection is carried out with the outer space 108 not being pressurized, the forces of pressing the separation wall 202, the bump components 104, and the circuit board 102 are lost and therefore, the circuit board 102 is permitted to be deformed, which causes the decrease in yield.

When the inner space 107 is depressurized with the depressurization pipe 204, preferably the injection pipe 203 is closed so that the airtightness is maintained. It also is preferable that the whole (hereinafter referred to as a "jig") including the supporting substrate 101 and the separation wall supporter 201 is independent of the depressurization pipe 204, the pressurization pipe 205, and the injection pipe 203.

In other words, as easily can be seen from the figure, in the present embodiment, some new ideas are included and rubber plugs and needle pipes are used. The tips of pipes 203, 204, and 205 are cut obliquely and thus are formed to be sharp. They are inserted into and removed from the rubber plugs. For the pressurization pipe 205, a rubber plug 206 is provided in an opening in the separation wall supporter 201. For the injection pipe 203 and the depressurization pipe 204, holes 207 are provided in the separation wall supporter 201, through which the pipes can pass and in which play remains. Thick portions of the separation wall 202 positioned under the holes 207 are utilized as rubber plugs. The needle pipes are inserted through the rubber plugs, so that depressurization, pressurization, and injection can be carried out. In addition, the airtightness of the inner and outer sides of the separation wall can be maintained when they are removed. Therefore, the whole jig is separated from the pipes and the like and then can be placed in a furnace so that an adhesive, solder, underfill, or the like is cured. This is important for the simplification of mass production equipment.

The following description is directed to steps carried out when the mounting method by the aforementioned stud bump bonding is implemented using the present invention. Tops of bumps of a semiconductor chip (the bump component in the present invention) are brought into contact with a conductive adhesive spread to be thin on a flat plate and thus the conductive adhesive is applied to the bumps. Then, the semiconductor chip is mounted with the bumps facing down and being positioned with respect to corresponding electrodes 103 on the circuit board 102 placed on the supporting substrate 101 shown in FIG. 2.

Next, the separation wall supporter 201 with the separation wall 202 (hereinafter referred to as an "upper jig") is placed to cover the mounted semiconductor chip, and the pressurization pipe 205 is inserted to send pressurized air into the outer space 108 and then is removed. The pressing force is maintained due to the effect of the rubber plug 206 even after the removal of the pressurization pipe 205, and therefore the semiconductor chip 104 is pressed down, which allows the circuit board 102 to be flat. As a result, uniform connection is maintained. In this state, it is placed in a heating furnace so that the conductive adhesive is dried, cured, or melted. The furnace may be a batch furnace or an in-line belt furnace.

As a next step, the depressurization pipe 204 is inserted and the inner space 107 is depressurized. Afterward, the injection pipe 203 is inserted and an underfill is injected. When the inner space 107 is filled with the underfill, the injection is stopped. Then, the depressurization pipe 204 and the injection pipe 203 are removed and the rest is placed in a heating furnace for curing the underfill. Thus, the mounting process is completed. The upper jig can be removed easily since the separation wall 202 is made of a material (for example, silicone resin) to which the underfill does not adhere. This also is important for the mass production process. The bump-component mounted body thus obtained may be cut to be separated as required.

When the separation wall supporter 201 and the separation wall 202 are formed of transparent members, bump components 104 may be heated by irradiation of light instead of the placement in the heating furnace, so that the conductive adhesive and the underfill can be cured with the heat.

Figure 3:
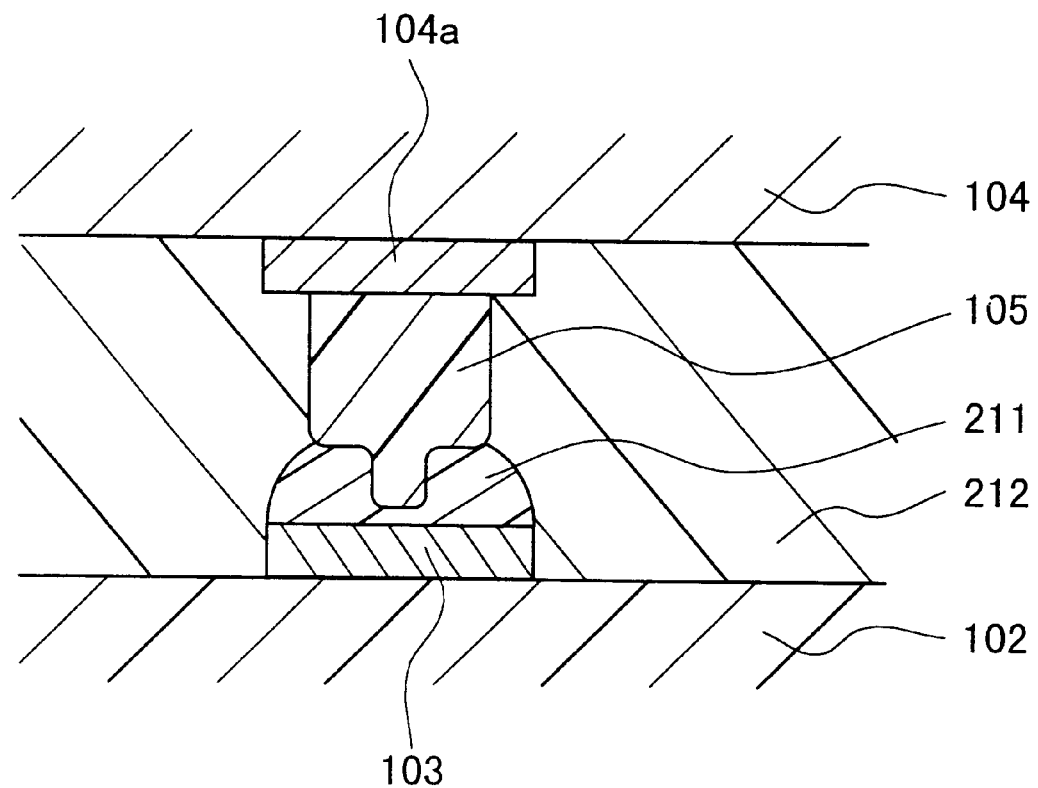
FIG. 3 is a sectional view showing a main portion of a bump-component mounted body of the present invention obtained by stud bump bonding.

FIG. 3 shows an enlarged sectional view of a bump portion in the bump-component mounted body thus obtained. In FIG. 3, numeral 104a indicates an electrode of a bump component 104, numeral 105 a bump (stud bump) formed on the electrode 104a, numeral 211 a conductive adhesive for connecting the bump 105 and an electrode 103 on the circuit board 102, and numeral 212 an underfill filling the space between the bump component 104 and the circuit board 102.

In the above-mentioned mounting method, the conductive adhesive may be applied not to the bump of the bump component but to the electrode on the circuit board. FIG. 3 shows the case where the bump 105 is a stud bump with a two-level form, but the bump 105 is not limited to the stud bump. Besides, single-level bumps with a cylindrical shape, a spherical shape, or the like also can be used.

The present invention also is applied in the same manner to the case where a bump component provided with solder bumps such as a CSP or a BGA package is mounted on a circuit board 102. Instead of the conductive adhesive, a solder paste is printed on electrodes 103 and the CSP or BGA package is mounted thereon, on which then the upper jig is placed. After the outer space 108 is pressurized, the whole is heated. The above-mentioned step of drying or curing the conductive adhesive may be replaced by a heat-melting (reflow) step. Since the BGA package or the CSP is pressed from the upper side, no instability in connection is caused. Furthermore, when the underfill is required, the same steps of injecting it as in the above may be carried out. After the reflow step, when washing is required, a washing liquid may be poured into the inner space 107 from one of the pipes in the same manner as in the step of injecting the underfill and may be sucked up from the other pipe. In this case, the washing is not exposed to the outside, which serves for reducing pollution problems.

Figure 4:
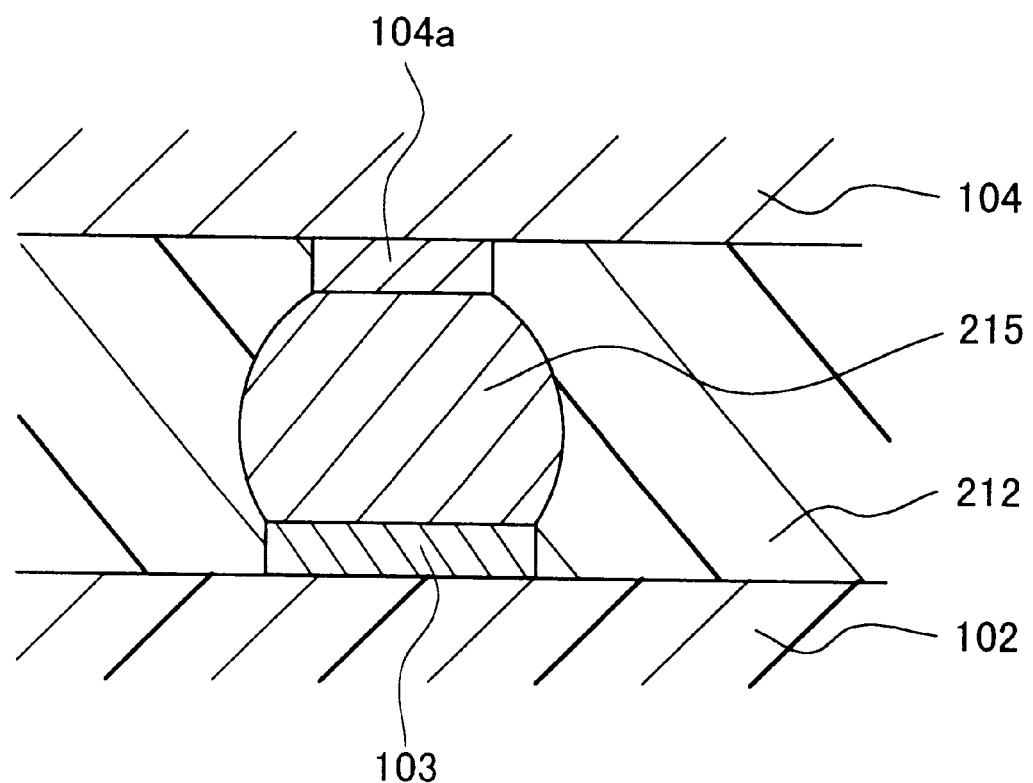
FIG. 4 is a sectional view showing a main portion of a mounted body according to the present invention on which a bump component with a solder bump is mounted.

FIG. 4 shows an enlarged sectional view of a bump portion of the bump-component mounted body thus obtained. In FIG. 4, numeral 215 indicates a solder bump. The solder bump 215 goes through the reflow step to connect an electrode 104a of a bump component 104 and an electrode 103 on the circuit board 102. Numeral 212 denotes an underfill filling the space between the bump component 104 and the circuit board 102. Since the solder bump 215 has high mechanical strength, the underfill 212 may not be injected in some cases.

Furthermore, an adhesive such as an ACF, ACP, NCP, or the like also can be used. In such a case, the following steps may be carried out.

Figure 5:
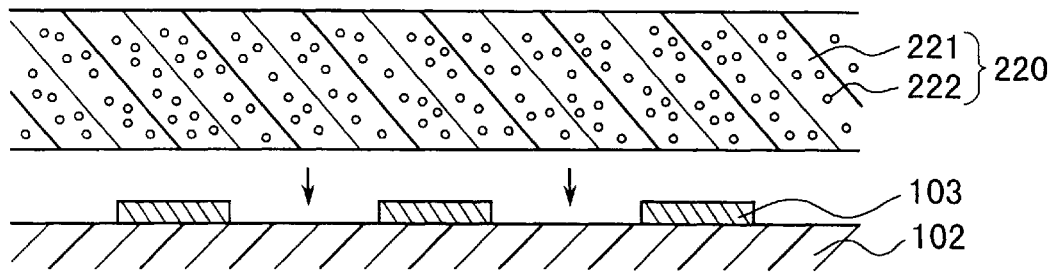
FIG. 5 is a partial and enlarged sectional view showing a step in a method of manufacturing a mounted body according to the present invention using an ACF.
Figure 6:
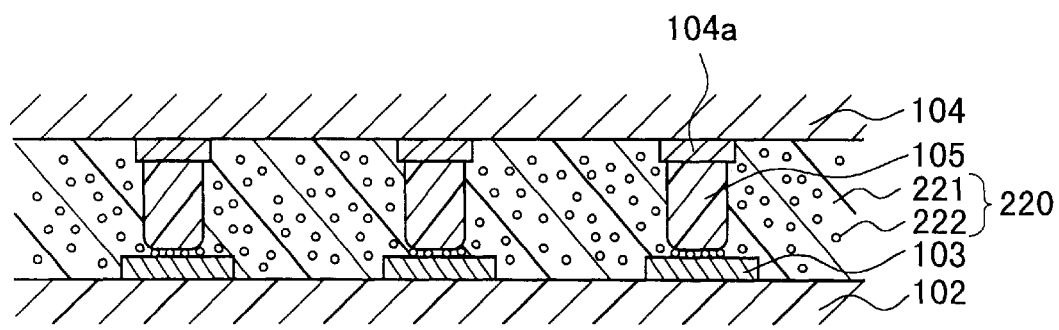
FIG. 6 is a sectional view showing a main portion of a bump-component mounted body of the present invention with an ACF

A mounting method using an ACF is described with reference to FIGS. 5 and 6. First, as in the mounting method described above, a circuit board 102 is placed on a supporting substrate 101. Then, as shown in FIG. 5, an ACF 220 is placed on an electrodes 103 on the circuit board 102. The ACF 220 is a film having a self-supporting property containing conductive fine particles 222 dispersed in an adhesive resinous component 221. Then, a bump component 104 is aligned and placed on the ACF 220, and the upper jig is placed thereon. Then, the outer space 108 is pressurized. In this state, it is placed in a heating furnace and thus the ACF 220 is cured or melted. Afterward, the upper jig is removed and thus a bump-component mounted body is obtained. FIG. 6 is a sectional view showing a main portion of the bump-component mounted body thus obtained. The ACF 220 is pressurized by the pressure difference provided between the inner and outer sides of the separation wall 202 as the bumps 105 are pressed into the ACF 220. Thus, the ACF 220 is deformed to fill the space between the bump component 104 and the circuit board 102 with no space being left. In this state, the conductive fine particles 222 between the bumps 105 and the electrodes 103 on the circuit board 102 come into contact with one another, so that the electrical connections between the bumps 105 and the electrodes 103 are established.

Next, a mounting method using an ACP is described. The ACP is a paste containing conductive fine particles dispersed in an adhesive resinous component as in the ACF. Initially, the ACP is applied to a predetermined place on a circuit board 102 placed on a supporting substrate 101. The ACP may be applied to a bump component 104. Then, as in the case of the ACF, the bump component 104 is aligned and placed on the circuit board 102. Afterward, the same steps as in the case of the ACF are carried out. Thus, the same bump-component mounted body as that obtained using the ACF shown in FIG. 6 is obtained.

Figure 7:
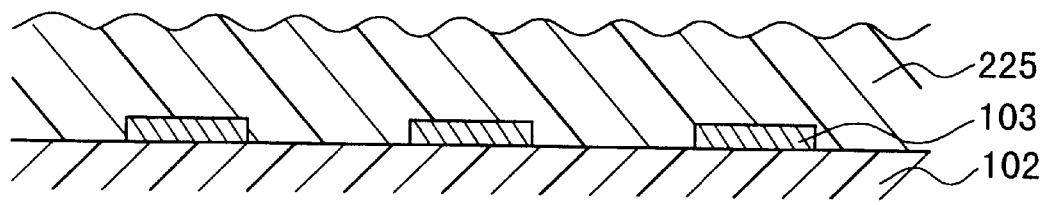
FIG. 7 is a partial and enlarged sectional view showing a step in a method of manufacturing a mounted body according to the present invention using an NCP.
Figure 8:
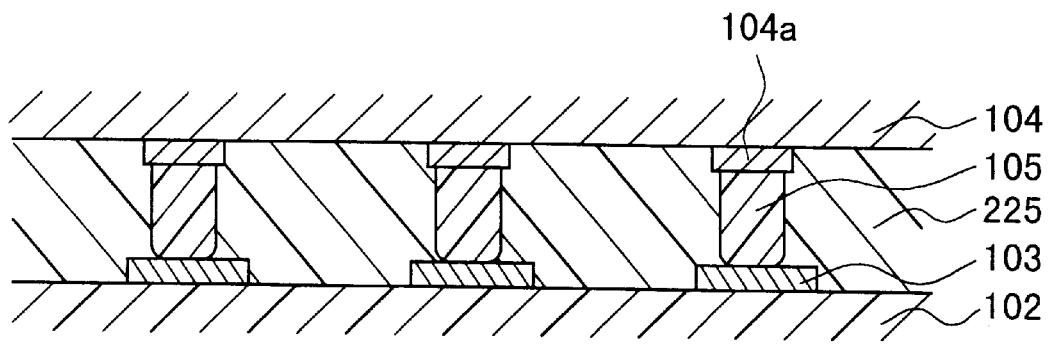
FIG. 8 is a sectional view showing a main portion of a bump-component mounted body according to the present invention with an NCP.

A mounting method using an NCP is described with reference to FIGS. 7 and 8. The NCP is a paste made of adhesive resin with an insulation property and contains no conductive fine particles, which is different from the ACP. Initially, a circuit board 102 is placed on a supporting substrate 101. Then, as shown in FIG. 7, an NCP 225 is applied to a predetermined place on the circuit board 102. The NCP 225 may be applied to a bump component 104. Then, as in the case of the ACP, the bump component 104 is aligned and placed on the circuit board 102. Afterward, the same steps as in the case of the ACF are carried out. FIG. 8 shows a sectional view of a main portion of the bump-component mounted body thus obtained. As the bumps 105 are pressed into the NCP 225 by the pressure difference provided between the inner and outer sides of a separation wall 202, the NCP 225 is pressed to be deformed and thus filling the space between the bump component 104 and the circuit board 102 with no space being left. The electrical connections are established by direct contacts between the bumps 105 and the electrodes 103, which is different from the cases of the ACF and ACP shown in FIG. 6.

When using the above-mentioned ACF, ACP, or NCP, it also serves as an underfill, the step of underfill injection is not required.

The present invention is excellent in causing no instable state due to warp of the circuit board 102 caused in the heating step and handling after the bump component 104 is mounted.

In the description of the embodiment described above, no force compelling the circuit board 102 to be flat acts on the circuit board 102 before the placement of the upper jig, for example, when the bump components 104 are mounted on the circuit board 102. When such a compelling force is required at this stage, using an air permeable substrate for the supporting substrate 101, the circuit board 102 is urged into close contact with the air permeable substrate through depressurization from the lower side, and thus such a compelling force is allowed to act on the circuit board 102. Similarly during the injection of the underfill with the inner space 107 being depressurized, the circuit board 102 is urged into close contact with the air permeable substrate through depressurization, so that the warp of the circuit board 102 during the injection may be prevented.

When the circuit board 102 is placed to extend to the outside of the upper jig, electrical testing of the circuit can be carried out before the injection of the underfill. When a connection failure is found, the upper jig is removed, so that the circuit can be repaired easily.

Figure 2:
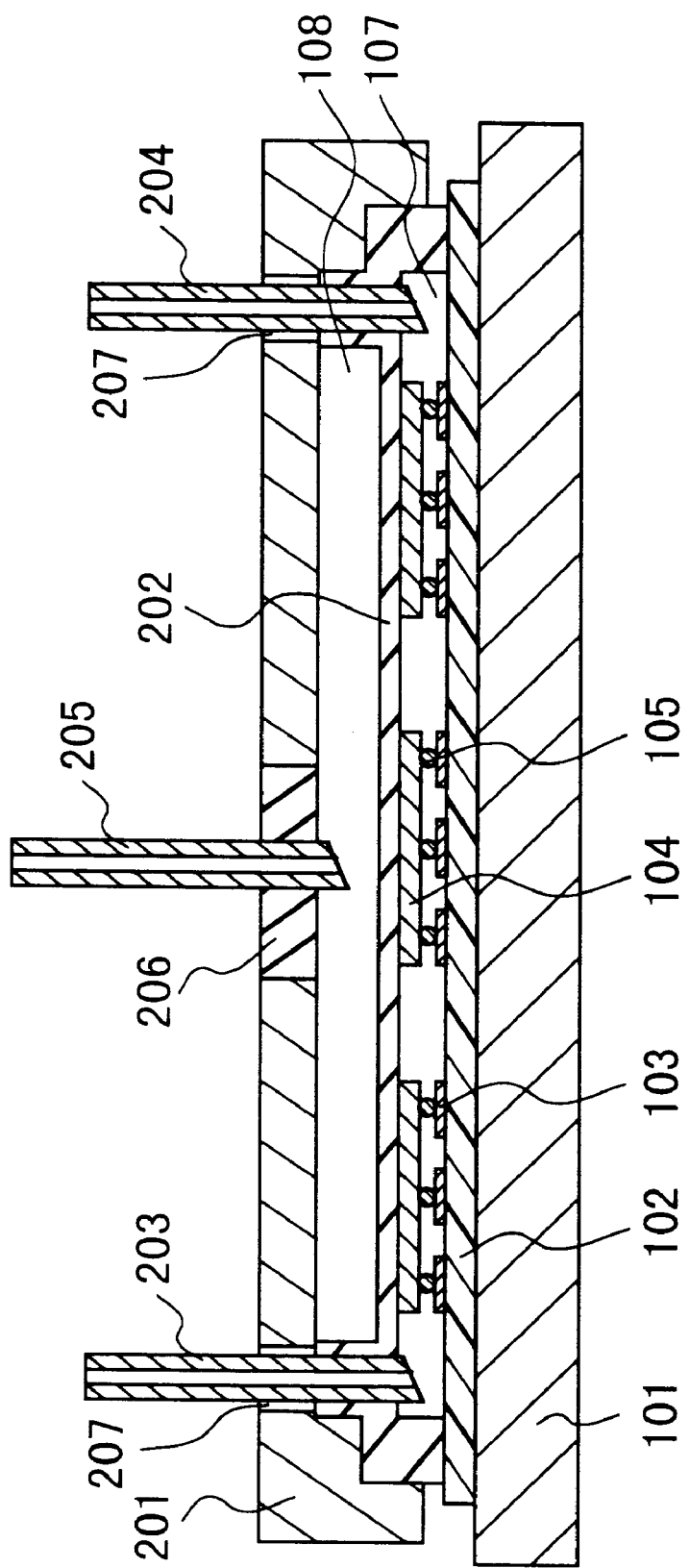
FIG. 2 is a sectional view explaining a further specific method of manufacturing a bump-component mounted body according to an embodiment of the present invention.
Figure 9:
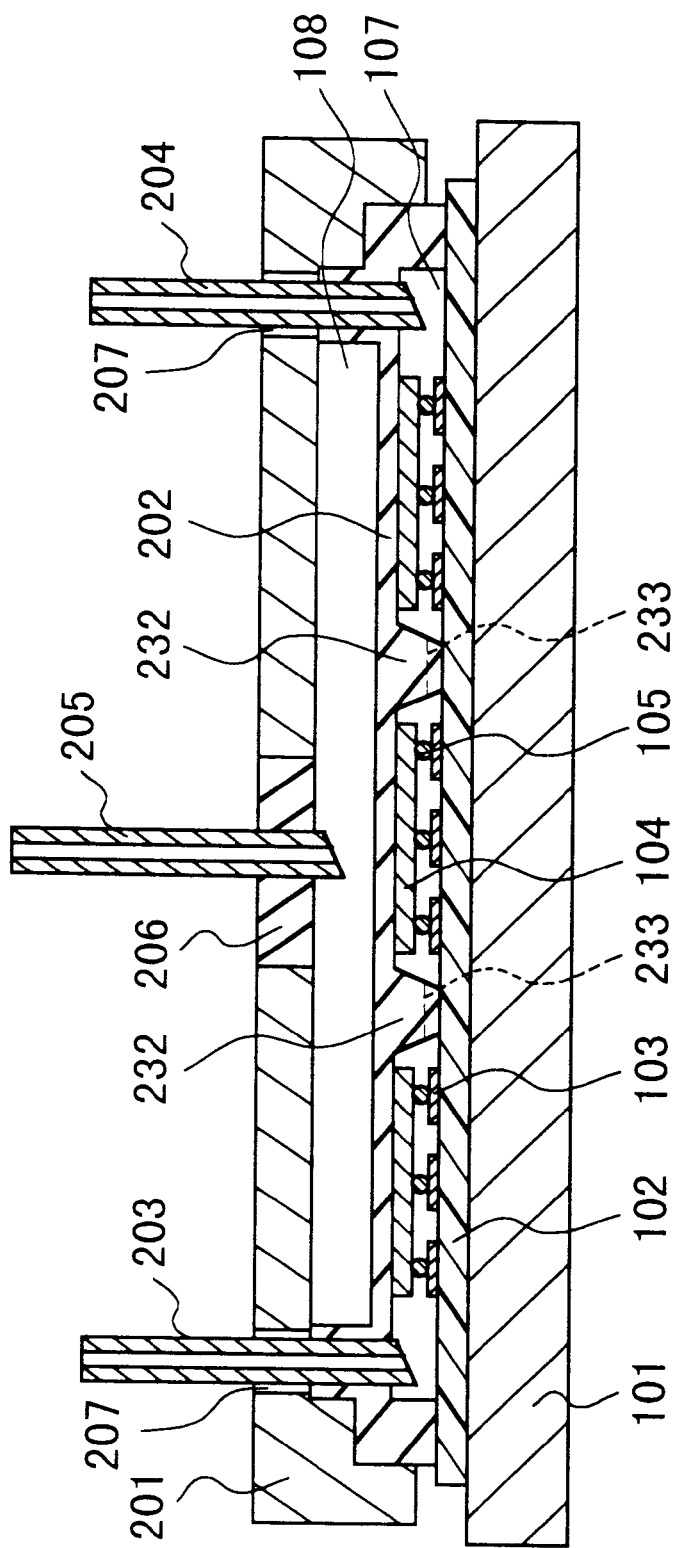
FIG. 9 is a sectional view explaining a method of manufacturing a bump-component mounted body according to another embodiment of the present invention.

As the means for implementing the present invention, the use of the jig shown in FIG. 2 was described. However, modifications of the jig and many other implementation methods also are conceivable. For instance, it also is conceivable that the separation wall 202 is formed of a thin film and portions of the separation wall 202 between adjacent bump components 104 are brought into close contact with (or are allowed to be close to) the circuit board 102 by the pressure difference between the inner and outer sides of the separation wall 202. Alternatively, the separation wall 202 may be provided with ribs 232 formed to provide partitions between respective bump components 104 as shown in FIG. 9. In FIG. 9, numeral 233 indicates grooves provided on the ribs 232 for balancing the pressure difference between adjacent spaces separated by the ribs 232 or injecting an underfill. As in the above, the underfill is hardly formed in the places where the portions of the separation wall 202 are in close contact with (or are close to) the circuit board 102 or the places where the ribs 232 are provided. These places can be used as cuts for facilitating the separation of the bump-component mounted body when the bump-component mounted body is cut to be separated into parts each of which includes at least one bump component. It should be appreciated that such a configuration also does not depart from the present invention.

In FIG. 2, the jig is illustrated in which one of each of the injection pipe 203, the depressurization pipe 204, and the pressurization pipe 205 can be inserted. However, the number and the insertion positions of the pipes 203, 204, and 205 are not limited to the configuration shown in FIG. 2. Particularly, with respect to the injection pipe 203, it may be positioned at the center or a plurality of the injection pipes may be positioned in different places with considerations to the shape of the inner space 107 and the positions of the bump components 104, so that effects may be obtained such that the speed at which the underfill is injected is increased or portions which are not filled with the underfill are prevented from being present.

In addition, after the bump components 104 are placed on the circuit board 102, the upper jig may be placed thereon with a sheet-like member being interposed between the bump components 104 and the separation wall 202. This, for example, can prevent the underfill from adhering to the separation wall 202 or may facilitate the removal of the upper jig. When printing is provided on a sheet-like member and then it is integrated with the underfill, the sheet-like member can be an outer package film of the bump-component mounted body obtained eventually. As such a sheet-like member, resin films such as a polyester film, a polyimide film, or the like can be used depending on its purpose or intended use. Furthermore, a sheet-like member may be subjected to a surface treatment such as a mold-release treatment or the like.

The pressure difference between the inner and outer sides of the separation wall 202 provided so that the bump components 104 are pressed against the circuit board 102 is set suitably according to the method of connecting the bump components 104 and the circuit board 102. For instance, when they are connected via a conductive adhesive, the pressure difference is set so that a force of 0.01 to 0.2N is applied to each bump. When they are connected via an ACF, it is necessary to deform the ACF and therefore a larger force is required. Therefore, the pressure difference is set so that for example, a force of about 1N is applied to each bump.

The above description, was directed to the case where bump components with the same height are mounted. However, the present invention can be applied to the case where bump components with different heights are mounted. Furthermore, the present invention also can be applied to the case where chip capacitors or chip resistors that are general surface mounting electronic components with no bump are mounted together with bump components.

Figure 10:
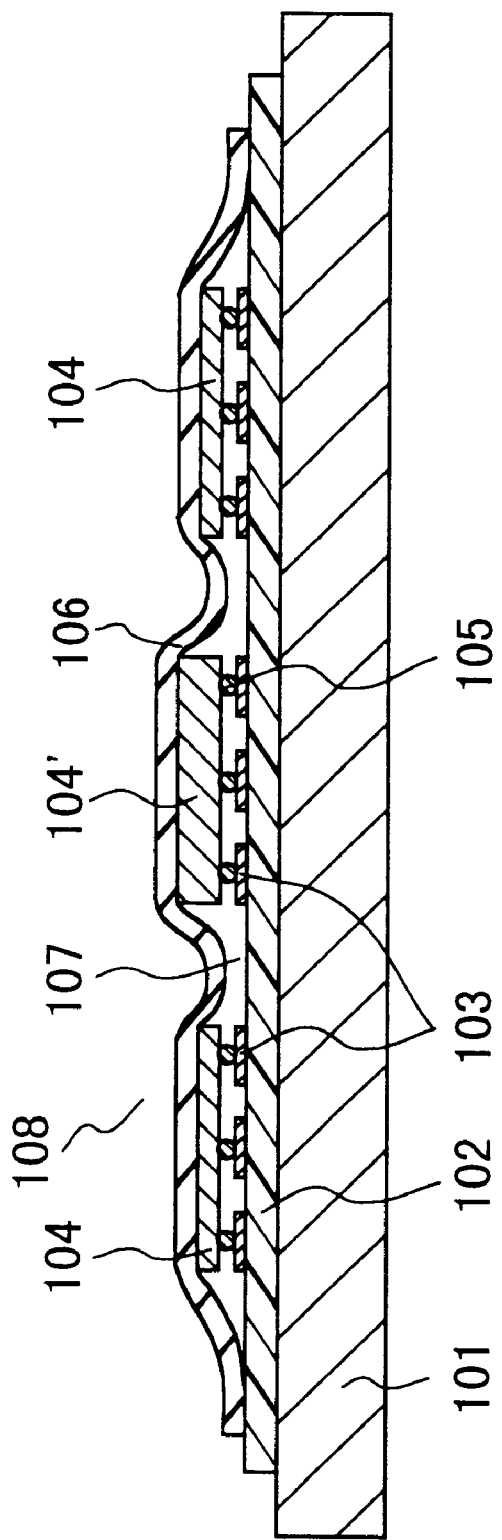
FIG. 10 is a sectional view showing a basic configuration of another embodiment of a method of manufacturing a bump-component mounted body according to the present invention.

FIG. 10 is a schematic sectional view showing a method of manufacturing a mounted body when bump components 104 and 104' with different heights are mounted together.

Figure 11:
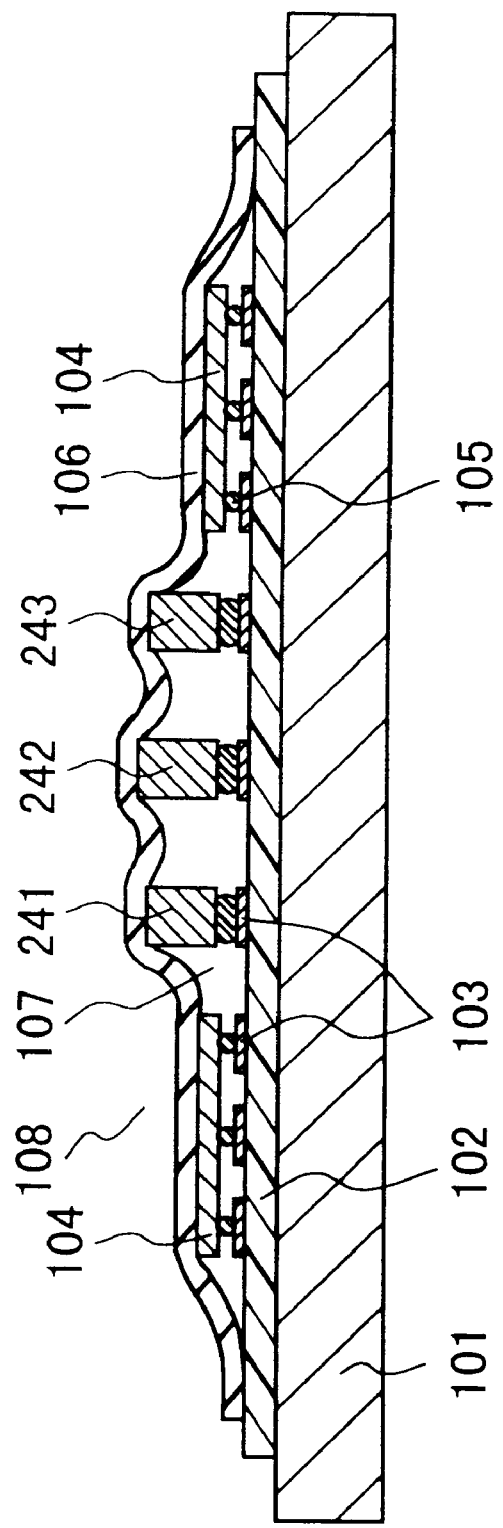
FIG. 11 is a sectional view showing a basic configuration of a further embodiment of a method of manufacturing a bump-component mounted body according to the present invention.

FIG. 11 is a schematic sectional view showing a method of manufacturing a mounted body when bump components 104 and general surface mounting electronic components 241, 242, and 243 such as chip capacitors or chip resistors are mounted together. As shown in FIGS. 10 and 11, even when components with different heights are present together, the separation wall 106 is deformed flexibly depending on the heights of the components and therefore pressing forces are applied to all the components.

Figures 12A, 12B:
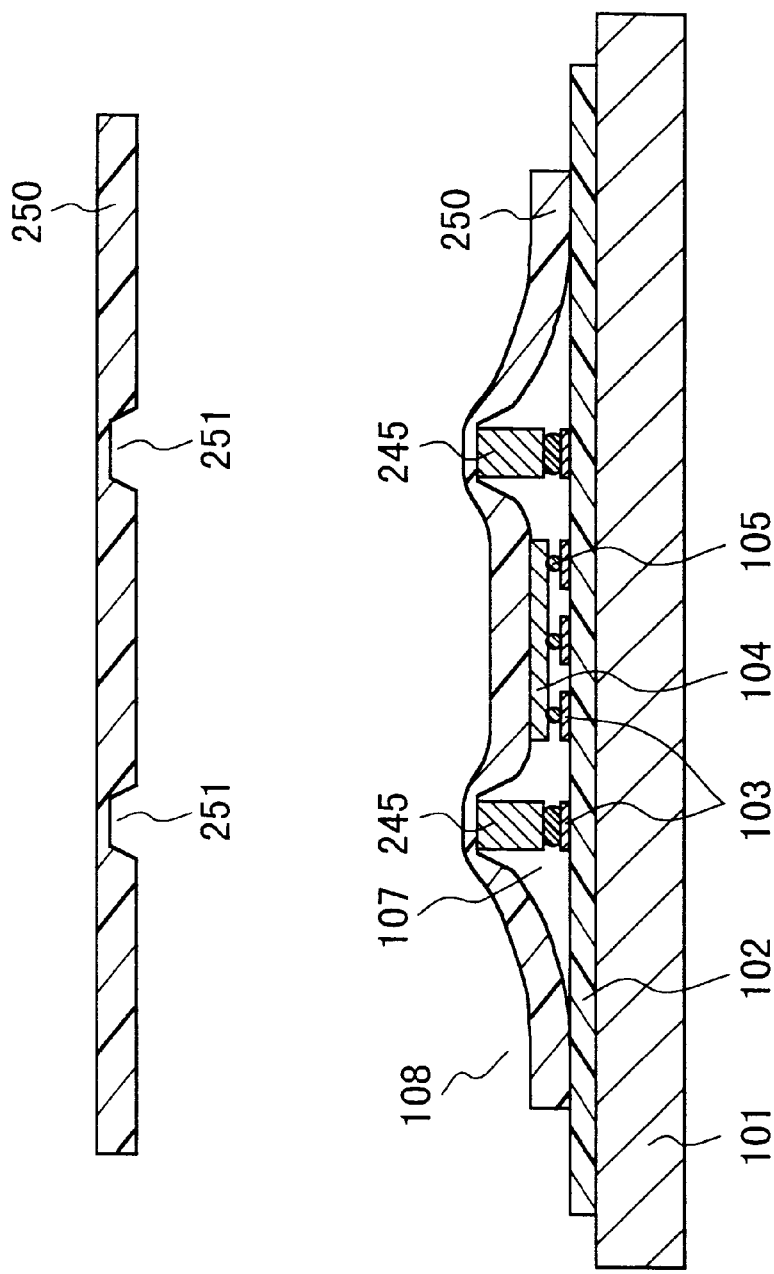
FIG. 12A is a sectional view showing a separation wall used for still another embodiment of a method of manufacturing a bump-component mounted body according to the present invention.
FIG. 12B is a sectional view showing a basic configuration of a method of manufacturing a bump-component mounted body using the separation wall.

In addition, the surface of the separation wall on the inner space side may be preprocessed (preformed) according to the high and low positions of the upper surfaces of the components. For instance, as shown in FIG. 12A, concave portions 251 are preformed in places corresponding to the positions where higher components are to be mounted, on one side of a separation wall 250. As shown in FIG. 12B, this allows a pressing force also to be applied to a lower bump component 104 positioned adjacent to the higher electron components 245. Alternatively, a convex portion capable of pressing a lower component may be preformed in a place corresponding to the position where the lower component is to be mounted on one side of a separation wall, which is different from the case shown in FIG. 12A.

As is apparent from FIGS. 11 and 12B, when an underfill is injected into the inner space 107, the underfill can be formed around the higher components 241, 242, 243, and 245 in a fillet form. This enables the mounting strength of such components to be strengthened.

FIGS. 10, 11, and 12B merely illustrate conceptual basic configurations of examples of an embodiment of a method of manufacturing a mounted body according to the present invention. It should be appreciated that the separation walls shown in these figures may be supported by the separation wall supporter such as shown in FIG. 9.

In the present invention, as is clear from the above description, it should be interpreted broad that the separation wall is "flexible" and it means that the separation wall has flexibility at a level allowing the bump components in the inner space to be pressed by the pressure difference between the inner and outer sides of the separation wall. Furthermore, preferably the separation wall has flexibility at a level allowing portions of the separation wall to be brought into close contact with a circuit board by being pressed against the circuit board to form the hermetic space inside the separation wall.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A method of manufacturing a bump-component mounted body, comprising pressing down a plurality of bump components mounted on a circuit board by a pressure difference provided between inner and outer sides of a flexible separation wall provided to cover the plurality of bump components.

2. The method of manufacturing a bump-component mounted body according to claim 1, further comprising heating that is carried out while the plurality of bump components is pressed down by the pressure difference.

3. The method of manufacturing a bump-component mounted body according to claim 1, further comprising cutting the circuit board.

4. The method of manufacturing a bump-component mounted body according to claim 1, wherein at least one of the plurality of bump components is different in height from the rest of the plurality of bump components.

5. The method of manufacturing a bump-component mounted body according to claim 1, further comprising mounting an electronic component other than the plurality of bump components on the circuit board together with the plurality of bump components.

6. A method of manufacturing a bump-component mounted body, comprising injecting an underfill into a space inside a flexible separation wall provided to cover bump components mounted on a circuit board during or after depressurizing the space inside the flexible separation wall, the space inside the flexible separation wall being formed between the circuit board and the flexible separation wall.

7. A method of manufacturing a bump-component mounted body, comprising:
 flip-mounting a plurality of bump components on a circuit board;
 forming a space inside a flexible separation wall between the flexible separation wall and the circuit board by covering the plurality of bump components with the flexible separation wall; and
 pressing the plurality of bump components against the circuit board by providing a pressure difference between inner and outer sides of the flexible separation wall.

8. The method of manufacturing a bump-component mounted body according to claim 7, further comprising: before the flip-mounting,
 applying a conductive adhesive to bumps of the plurality of bump components or to electrodes on the circuit board; and after the pressing,
 drying, curing, or melting the conductive adhesive with the plurality of bump components being pressed against the circuit board,
 injecting an underfill into the space inside the flexible separation wall during or after depressurizing the space inside the flexible separation wall; and
 curing the underfill.

9. The method of manufacturing a bump-component mounted body according to claim 8, wherein in injecting the underfill, a space on an opposite side of the flexible separation wall to that on which the space inside the flexible separation wall is formed is pressurized.

10. The method of manufacturing a bump-component mounted body according to claim 7, further comprising, after the pressing, melting solder bumps with the plurality of bump components being pressed against the circuit board, the solder bumps being provided on the plurality of bump components.

11. The method of manufacturing a bump-component mounted body according to claim 7, further comprising, after the pressing of the plurality of bump components against the circuit board, drying, curing, or melting an adhesive with the plurality of bump components being pressed against the circuit board,
 wherein the adhesive is provided between the plurality of bump components and the circuit board in the flip-mounting.

12. The method of manufacturing a bump-component mounted body according to claim 7, further comprising cutting the circuit board.

13. The method of manufacturing a bump-component mounted body according to claim 7, wherein a sheet-like member is provided between the plurality of bump components and the flexible separation wall.

14. The method of manufacturing a bump-component mounted body according to claim 7, wherein at least one of the plurality of bump components is different in height from the rest of the plurality of bump components.

15. The method of manufacturing a bump-component mounted body according to claim 7, further comprising, before forming a space inside a flexible separation wall, mounting an electronic component other than the plurality of bump components on the circuit board.

16. A device for manufacturing a bump-component mounted body, comprising:
   a supporting substrate on which a circuit board is placed;
   a flexible separation wall;
   a separation wall supporter for maintaining the flexible separation wall; and
   a hermetic space formed between the flexible separation wall and the separation wall supporter.

17. The device for manufacturing a bump-component mounted body according to claim 16, wherein a space inside the flexible separation wall is formed hermetically by the flexible separation wall and the circuit board when the separation wall supporter maintaining the flexible separation wall and the supporting substrate are combined with the circuit board being interposed therebetween.

18. The device for manufacturing a bump-component mounted body according to claim 17, further comprising a rubber plug into which a depressurization pipe for depressurizing the space inside the flexible separation wall is to be inserted.

19. The device for manufacturing a bump-component mounted body according to claim 17, further comprising a rubber plug into which an injection pipe is to be inserted, the injection pipe being used for injecting an underfill into the space inside the flexible separation wall.

20. The device for manufacturing a bump-component mounted body according to claim 16, further comprising a rubber plug into which a pressurization pipe is to be inserted, the pressurization pipe being used for pressurizing the hermetic space defined by the flexible separation wall and the separation wall supporter.

21. The device for manufacturing a bump-component mounted body according to claim 16, wherein the supporting substrate urges the circuit board into close contact therewith and maintains the circuit board.

22. The device for manufacturing a bump-component mounted body according to claim 16, wherein when the separation wall supporter maintaining the flexible separation wall and the supporting substrate are combined with the circuit board being interposed therebetween, part of wiring of the circuit board is exposed.

* * * * *